United States Patent
Rajivan et al.

[19]

[11] Patent Number: 5,973,541
[45] Date of Patent: Oct. 26, 1999

[54] PARAMETRIC TUNING OF AN INTEGRATED CIRCUIT AFTER FABRICATION

[75] Inventors: Sathyanandan Rajivan, San Jose; Raoul B. Salem, Redwood City, both of Calif.

[73] Assignee: Sun Microsystems, Inc., Palo Alto, Calif.

[21] Appl. No.: 08/927,976

[22] Filed: Sep. 11, 1997

Related U.S. Application Data

[62] Division of application No. 08/449,716, Jul. 7, 1995, Pat. No. 5,729,158.

[51] Int. Cl.$^6$ ................................................. H03K 17/04
[52] U.S. Cl. ........................... 327/374; 327/376; 326/31; 326/34
[58] Field of Search .................. 326/31, 33, 34, 326/35, 17; 327/270, 278, 283, 374, 376, 377, 393, 401, 534, 537

[56] References Cited

U.S. PATENT DOCUMENTS

| | | | |
|---|---|---|---|
| 4,604,731 | 8/1986 | Konishi | 365/203 |
| 5,121,014 | 6/1992 | Huang | 307/605 |
| 5,373,199 | 12/1994 | Shichinohe et al. | 326/31 |
| 5,467,041 | 11/1995 | Baba et al. | 327/276 |
| 5,471,663 | 11/1995 | Davis | 455/296 |
| 5,729,158 | 3/1998 | Rajivan et al. | 327/393 |

*Primary Examiner*—Jung Ho Kim
*Attorney, Agent, or Firm*—Finnegan, Henderson, Farabow, Garrett & Dunner, L.L.P.

[57] ABSTRACT

The present invention provides an apparatus and method for repairing or improving the behavior of a tunable circuit of an integrated circuit (IC) when a target parameter exceeds a predetermined range due to a design and/or fabrication problem. The tunable circuit includes one or more tuning controllers for tuning a corresponding number of target circuits. Each tuning controller includes one or more registers and an optional decoder. Each target circuit includes a tunable portion and a functional portion. The functional portion can have one or more of a wide variety of functions including but not limited to logical gates, buffers, signal generators and amplifiers. The selectable parameters of the tunable circuit include timing delays, trip voltages, rise/fall times and/or output impedances. When a circuit designer wishes to tune the target parameter, an appropriate tuning pattern is latched into registers of the tuning controller. In turn, the tuning controller generates corresponding tuning pattern signals enabling target circuit(s) to changeably tune the target parameter by selectively enabling different tunable portions of the target circuit. For example, by selecting the appropriate load resistance and/or capacitance of the tunable circuit, the rise/fall time of the target circuit is tuned for compatibility with respect to the other portions of the IC or system. The tunable circuit of the present invention advantageously lends itself to post-fabrication correction of design or fabrication problems, thereby increasing the potential yield rate. In addition, the tunable circuit can be tested under different operating conditions in a non-destructive manner without the need for another time-consuming and costly IC fabrication cycle. Other advantages include the ability to selectively operate target circuit(s) of the IC at a higher speed under ideal conditions and at a lower speed under hostile conditions.

18 Claims, 13 Drawing Sheets

| DECODER INPUT | DECODER OUTPUT | | | |
|---|---|---|---|---|
| A B | $prg_1$ | $prg_2$ | $prg_3$ | $prg_4$ |
| 0 0 | 1 | 0 | 0 | 0 |
| 0 1 | 0 | 1 | 0 | 0 |
| 1 0 | 0 | 0 | 1 | 0 |
| 1 1 | 0 | 0 | 0 | 1 |

FIG. 2A

| DECODER INPUT | DECODER OUTPUT | | | |
|---|---|---|---|---|
| A B | $prg_1$ | $prg_2$ | $prg_3$ | $prg_4$ |
| 0 0 | 1 | 0 | 0 | 0 |
| 0 1 | 1 | 1 | 0 | 0 |
| 1 0 | 1 | 1 | 1 | 0 |
| 1 1 | 1 | 1 | 1 | 1 |

FIG. 2B

| prg 1 | prg 2 | prg 3 | Va/Vb RISE/FALL TIME |
|---|---|---|---|
| 1 | 1 | 1 | t8 |
| 1 | 1 | 0 | t7 |
| 1 | 0 | 1 | t6 |
| 1 | 0 | 0 | t5 |
| 0 | 1 | 1 | t4 |
| 0 | 1 | 0 | t3 |
| 0 | 0 | 1 | t2 |
| 0 | 0 | 0 | t1 |

*FIG. 4B*

| prg 1 | prg 2 | $V_{trip}$ |
|---|---|---|
| H | H | 0.5 v |
| H | L | 1.0 v |
| L | H | 1.15 v |
| L | L | 1.3 v |

*FIG. 5D*

| prg 1 | prg 2 | prg 3 | prg 4 | Vref |
|---|---|---|---|---|
| 0 | 0 | 1 | 1 | 1.75 |
| 0 | 1 | 1 | 1 | 1.65 |
| 1 | 1 | 1 | 1 | 1.5 |
| 1 | 1 | 0 | 1 | 1.4 |
| 1 | 1 | 0 | 0 | 1.3 |

*FIG. 6B*

| prg 1 | prg 2 | prg 3 | prg 4 | IMPEDENCE |
|---|---|---|---|---|
| 1 | 1 | 1 | 1 | 0.5k |
| 0 | 1 | 0 | 1 | 0.25k |
| 0 | 0 | 0 | 0 | 0.125k |

*FIG. 6C*

| prg 1 | prg 2 | prg 3 | prg 4 | Vout RISE/FALL TIME |
|---|---|---|---|---|
| 1 | 1 | 1 | 1 | t16 |
| 1 | 1 | 1 | 0 | t15 |
| 1 | 1 | 0 | 1 | t14 |
| 1 | 1 | 0 | 0 | t13 |
| 1 | 0 | 1 | 1 | t12 |
| 1 | 0 | 1 | 0 | t11 |
| 1 | 0 | 0 | 1 | t10 |
| 1 | 0 | 0 | 0 | t9 |
| 0 | 1 | 1 | 1 | t8 |
| 0 | 1 | 1 | 0 | t7 |
| 0 | 1 | 0 | 1 | t6 |
| 0 | 1 | 0 | 0 | t5 |
| 0 | 0 | 1 | 1 | t4 |
| 0 | 0 | 1 | 0 | t3 |
| 0 | 0 | 0 | 1 | t2 |
| 0 | 0 | 0 | 0 | t1 |

*FIG. 7B*

PARAMETRIC TUNING OF AN INTEGRATED CIRCUIT AFTER FABRICATION

This is a divisional of application Ser. No. 08/449,716, filed Jul. 7, 1995 U.S. Pat. No. 5,729,158.

BACKGROUND OF THE INVENTION

1. Field of the Invention

This invention relates to the field of integrated circuit design and testing. More particularly, the present invention relates to the tuning of integrated circuit parameters after fabrication.

2. Description of the Related Art

The typical design and fabrication of an integrated circuit (IC) involves the following steps. The desired functional behavior of the IC is first specified. Next, the various functional blocks needed to implement the desired functions are selected and strategically placed on the die of the IC. The output signal responses to anticipated input signal conditions of the functional blocks are defined. A processing technology suitable for the intended operating clock frequency and the circuit complexity of the IC is selected. The functional blocks are then implemented using circuit elements fabricated using the selected process technology. Finally, the circuit is fabricated and tested for proper functioning in response to the anticipated input signal conditions.

With the ever increasing complexity of large scale integrated (LSI) circuits, especially very large scale integrated (VLSI) circuits, the production of a completely bug-free and robust IC in a single design and fabrication cycle is an elusive if not impossible task. In addition, because the complex IC processing technology is aggravated by shrinking line geometries and interconnect resolutions slight variations in dopant levels or imperfections in circuit elements can cause a functional block to behave in a manner substantially different than intended. As a result, the unintended process variations can multiply the detrimental effects of any design problems and increase the deviation between the intended functional behavior and actual behavior of the IC.

While conventional computer aided design (CAD) tools such as circuit simulators are useful for predicting the behavior of ICs prior to fabrication, these CAD tools depend on mathematical models for approximating the underlying behavior of the circuit elements. Further, the achievable accuracy and resulting dependability of the IC simulations are limited by the available computer resource and the IC complexity. Hence, the generation of complete and accurate simulations of an entire VLSI circuit under all possible input signal and operating conditions is highly improbable. As a result, CAD tools have limited usefulness for detecting and correcting design errors.

Although conventional techniques for correcting some types of design and processing problems after fabrication do exist, these techniques only provide a partial solution because they provide limited relief and have major inherent disadvantages. Examples of conventional techniques include laser trimming of IC elements such as resistors, and the incorporation of redundant memory elements selectable by fusible links.

Laser trimming involves using a narrowly focused laser beam to remove by vaporizing a portion of an element or creating an electrical short across a portion of an element. In either case, the laser beam necessitates access to the IC itself and the resulting changes are irreversible, i.e., permanent in nature. In addition, the laser beam may cause damage to the surrounding crystalline structure of the IC and also creates a considerable amount of debris which can contaminate surrounding circuit elements, unless an extra area of the IC is dedicated for the creation of buffer zones.

Redundant circuits are generally cost effective only in circuits with a large number of predominantly repetitive functional blocks, e.g., memory arrays. For example, redundant memory circuits enables a designer to internally replace a faulty memory circuit with one of the redundant memory circuits after fabrication thereby partially mitigating the effects of design and/or processing problems. However, the location of the replacement redundant memory circuit typically results in a longer signal path with the accompanying increase in parasitic resistance and capacitance. U.S. Pat. No. 5,204,836, Reed, discloses a redundant memory storage structure implemented using duplicate arrays connected to laser zappable fuses.

Hence there is a need for VLSI circuits with target portion(s) which can be changeably tuned after fabrication to correct any circuit design problem and/or compensate for unintended parametric variations arising from the process steps.

SUMMARY OF THE INVENTION

The present invention provides an apparatus and method for repairing or improving the behavior of a tunable circuit of an integrated circuit (IC) when a target parameter exceeds a predetermined range due to a design and/or fabrication problem. The tunable circuit includes one or more tuning controllers for tuning a corresponding number of target circuits. Each tuning controller includes one or more registers and an optional decoder. Each target circuit includes a tunable portion and a functional portion. The functional portion can have one or more of a wide variety of functions including but not limited to logical gates, buffers, signal generators and amplifiers. The selectable parameters of the tunable circuit include timing delays, trip voltages or rise/fall times.

When a circuit designer wishes to tune the target parameter, for example in an attempt to correct the design or fabrication problem, an appropriate tuning pattern is latched into registers of the tuning controller. The tuning pattern can be provided to the tuning controller via input/output (I/O) pins of the IC package. In turn, the tuning controller generates corresponding tuning pattern signals enabling target circuit(s) to changeably tune the target parameter by selectively enabling different tunable portions of the target circuit.

In one embodiment, the target circuit is an amplification circuit and the target parameter is a timing delay for a control strobe signal of a sense amplifier of the amplification circuit. Hence, the tunable portion is a delay stage and the functional portion is the sense amplifier. In this example, a pair of differential input signals provided to the sense amplifier is substantially delayed by a design or fabrication problem. As a result the strobe signal is now premature and must be delayed by at least a corresponding amount of time. A multiplexer is used to select an appropriate delay in the timing of the strobe signal.

In another exemplary embodiment, the functional portion of the target circuit is a buffer with a selectable rise/fall time. By selecting the appropriate load resistance and/or capacitance of the tunable portion of the buffer, the rise/fall time of the buffer is tuned for compatibility with respect to the other portions of the IC.

The tunable circuit of the present invention advantageously lends itself to post-fabrication correction of design or fabrication problems, thereby increasing the potential yield rate. In addition, the tunable circuit can be tested under different operating conditions in a non-destructive manner without the need for another time-consuming and costly IC fabrication cycle. Other advantages include the ability to selectively operate target circuit(s) of the IC at a higher speed under ideal conditions and at a lower speed under hostile conditions.

DESCRIPTION OF THE DRAWINGS

The objects, features and advantages of the system of the present invention will be apparent from the following description in which:

FIGS. 2A and 2B are truth tables showing two exemplary sets of tuning patterns provided by a decoder of the tunable circuit.

FIG. 4B is a table showing representative rise times of the output signal of the buffer of FIG. 4A in response to tuning patterns.

FIG. 5D is a table showing the trip voltage of a domino stage of FIGS. 5A–5C as a function of exemplary tuning patterns.

FIGS. 6B and 6C are tables showing the output reference voltages and impedances, respectively, of the voltage generator of FIG. 6A as a function of exemplary tuning patterns.

FIG. 7B is a table showing representative rise/fall times of the inverting buffer of FIG. 7A in response to tuning patterns.

DESCRIPTION OF THIS PREFERRED EMBODIMENT

In the following description, numerous details provide a thorough understanding of the invention. These details include functional blocks and exemplary combinations of tuning and targeted circuits to assist a circuit designer in implementing a tunable circuit. In addition, while the tunable IC of the present invention is described with reference to specific CMOS implementations and process technologies, the invention is applicable to a wide variety of process technologies, e.g., NMOS, bipolar-CMOS (BiCMOS) and emitter coupled logic (ECL). In other instances, well-known circuits and structures are not described in detail so as not to obscure the invention unnecessarily.

Figure 1:
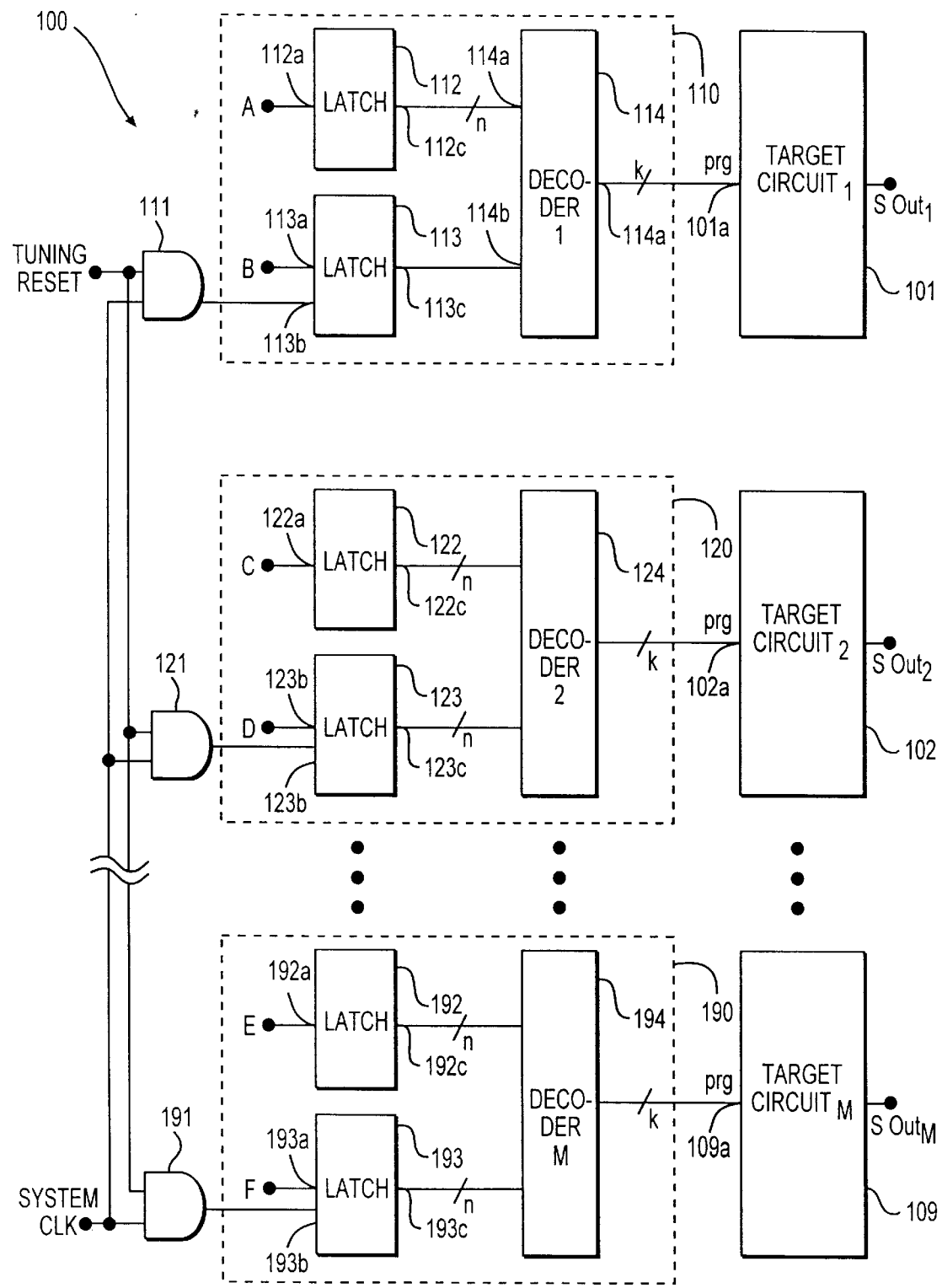
FIG. 1 is a block diagram of one embodiment of a tunable circuit in accordance with the present invention.

FIG. 1 is a block diagram of one embodiment of tunable circuit 100 in accordance with the present invention. Tunable circuit 100 includes one or more tuning controllers 110, 120, . . . 190 for tuning a corresponding plurality of target circuits 101, 102, . . . 109. Each tuning controller includes one or more latches/registers and an optional decoder. Input data streams (A, B, C, D, E, F) is provided at the respective input nodes of six exemplary latches 112, 113, 122, 123, 192, 193. For example, tuning controller 110 includes latches 112, 113 and a decoder 114, with input data streams (A, B) provided at input nodes 112a, 113a, respectively. Output nodes 112c, 113c of latches 112, 113, respectively, are coupled to decoder 114. In turn, output node 114c of decoder 114 are coupled to target circuit 101. Note that due to the repetitive nature of tuning controllers 110, 120, . . . 190, a description of the combination comprising tuning controller 110 and target circuit 101 is equally applicable to the respective combinations of tuning controller and target circuits 120 and 102, . . . 190 and 109. In addition, target circuits 101, 102, . . . 109 can be any one of exemplary target circuits described in greater detail below, or combinations thereof.

The operation of tunable circuit 100 is as follows. First, latches 112, 113 are loaded via input nodes 112a, 113a, respectively, with the appropriate tuning states for generating a tuning pattern which corresponds to a desired circuit parameter, e.g., a trip voltage level, for target circuit 101. Latches 112, 113 are clocked using a suitable clock signal, e.g., a "TUNING RESET & SYSTEM CLK" signal, via AND gate 111 during a reset cycle, e.g., a system-wide reset cycle or a tuning reset cycle. In this example, input nodes 112a, 113a receive serial input data streams (A, B) representing the desired tuning states so as to reduce the number of required input/output (I/O) pins for tunable circuit 100. These tuning states are made available at output nodes 112c, 113c of latches 112, 113 and provided to input nodes 114a, 114b of decoder 114, respectively. Next, decoder 114 converts the tuning states into the selected tuning pattern at output node 114c. The tuning pattern is then provided to input node 101a of target circuit 101. In some embodiments, depending on the degree of tuning granularity desired, decoder 114 may be eliminated, with latches 112, 113 directly providing the tuning pattern. In other embodiments, where the circuit complexity of tuning controllers 110, 120, . . . 190 is of concern, latches 112, 113, 122, 123, . . . 192, 193 can be replaced with fusible links, thereby trading off flexibility for reduced circuit complexity. FIGS. 2A and 2B are truth tables showing two exemplary sets of tuning patterns, corresponding to input data streams (A, B), and provided by decoder 114, wherein n=2, k=4, and prg=(prg1, prg2, prg3, prg4).

As discussed above, target circuit 101 can be one of a wide variety of circuits. Target circuit 101 includes a tunable portion and a functional portion. FIGS. 3A, 4A, 5A, 5B, 6A and 7A show exemplary implementations of target circuits. In addition, target circuit 101 can also be a combination of two or more of the exemplary circuits.

Figure 3A:
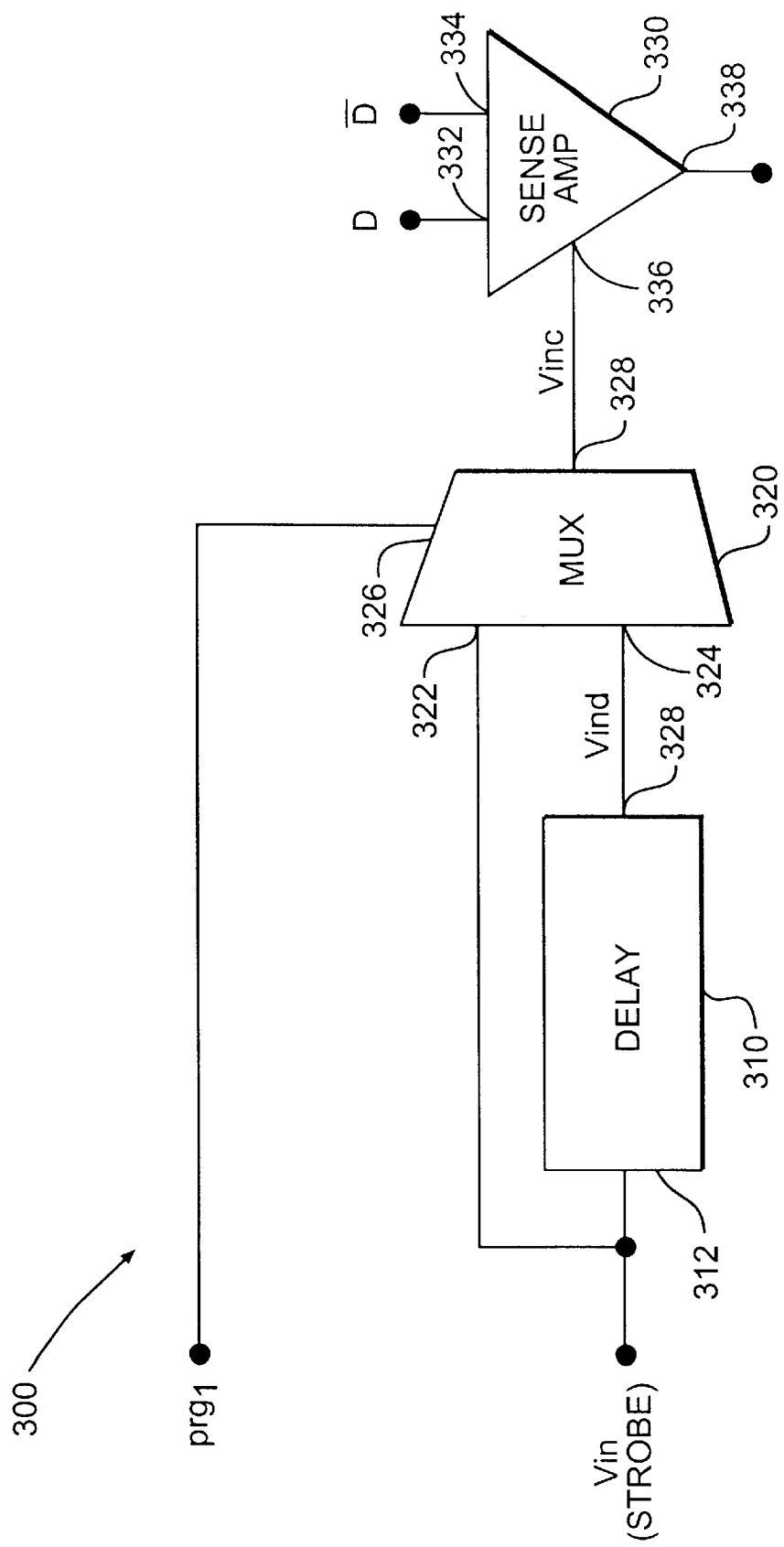
FIG. 3A is a block diagram illustrating a tunable amplification circuit.

In one embodiment of target circuit 101 as shown in FIG. 3A, target circuit 101 is an amplification circuit 300. The tunable portion includes a selectable delay stage 310 and a multiplexor (MUX) 320. The functional portion of target circuit 101 is a sense amplifier 330 of amplification circuit 300. In this embodiment, delay stage 310 is a non-inverting buffer circuit, e.g., an even number of cascaded inverters. MUX 320 can be replaced by fusible links or equivalents.

A strobe signal Vin for controlling sense amplifier 330 is provided at input node 312 of delay stage 310 and also at a first input node 322 of MUX 320. Consequently, a delayed strobe signal Vind produced at output node 314 of delay stage 310 is provided to a second input node 324 of MUX 320. One of the two input signals provided to MUX 320 is selected by a tuning pattern signal prg1 via control node 326. The selected output control signal Vinc at the output node 328 of MUX 320 is provided to a control node 336 of sense amplifier 330, thereby providing a delay selectable strobe signal Vinc at control node 336.

Figure 3B:
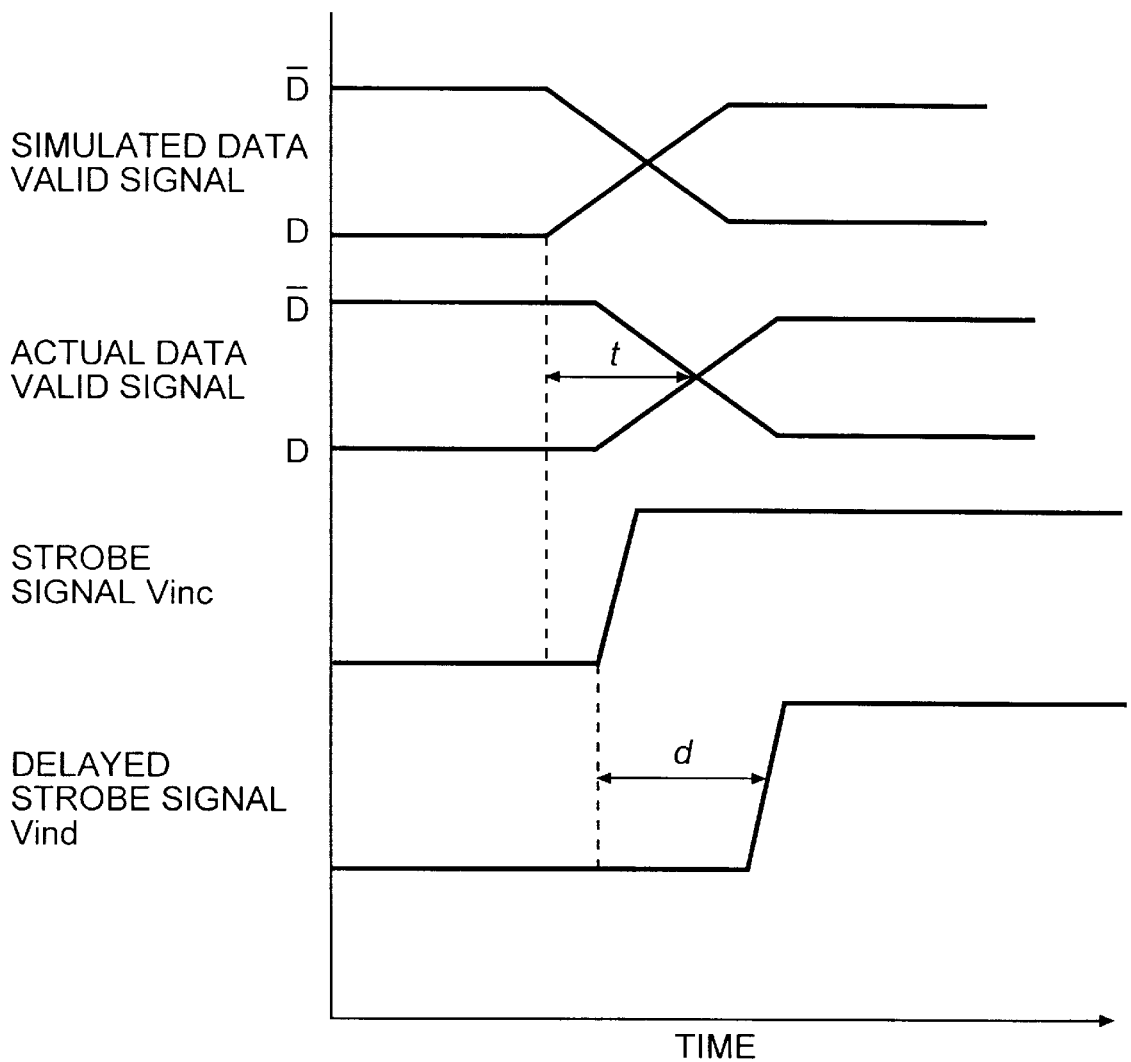
FIG. 3B is a timing diagram showing a simulated and an actual delayed strobe signal of the amplification circuit of FIG. 3A.

Applications of amplification circuit 300 include a memory array where sense amplifier 330 may be shared by a column of memory cells (not shown). A pair of differential output signals from the memory column is provided as a pair of differential input signals to input nodes 332, 334 of sense amplifier 330. In one scenario, as shown in the timing diagram of FIG. 3B, the actual data valid signal corresponding to the differential input signals provided to sense amplifier 330 is delayed by time t relative to the simulated data valid signal computed during the design stage. As a result, strobe signal Vin is now premature with respect to the differential input signals. In this scenario, MUX 320 is used to select the delayed strobe signal path (delayed by time d) through delay stage 310, wherein d is greater than or equal to t, thereby providing an appropriately delayed strobe signal for controlling sense amplifier 330.

Figure 4A:
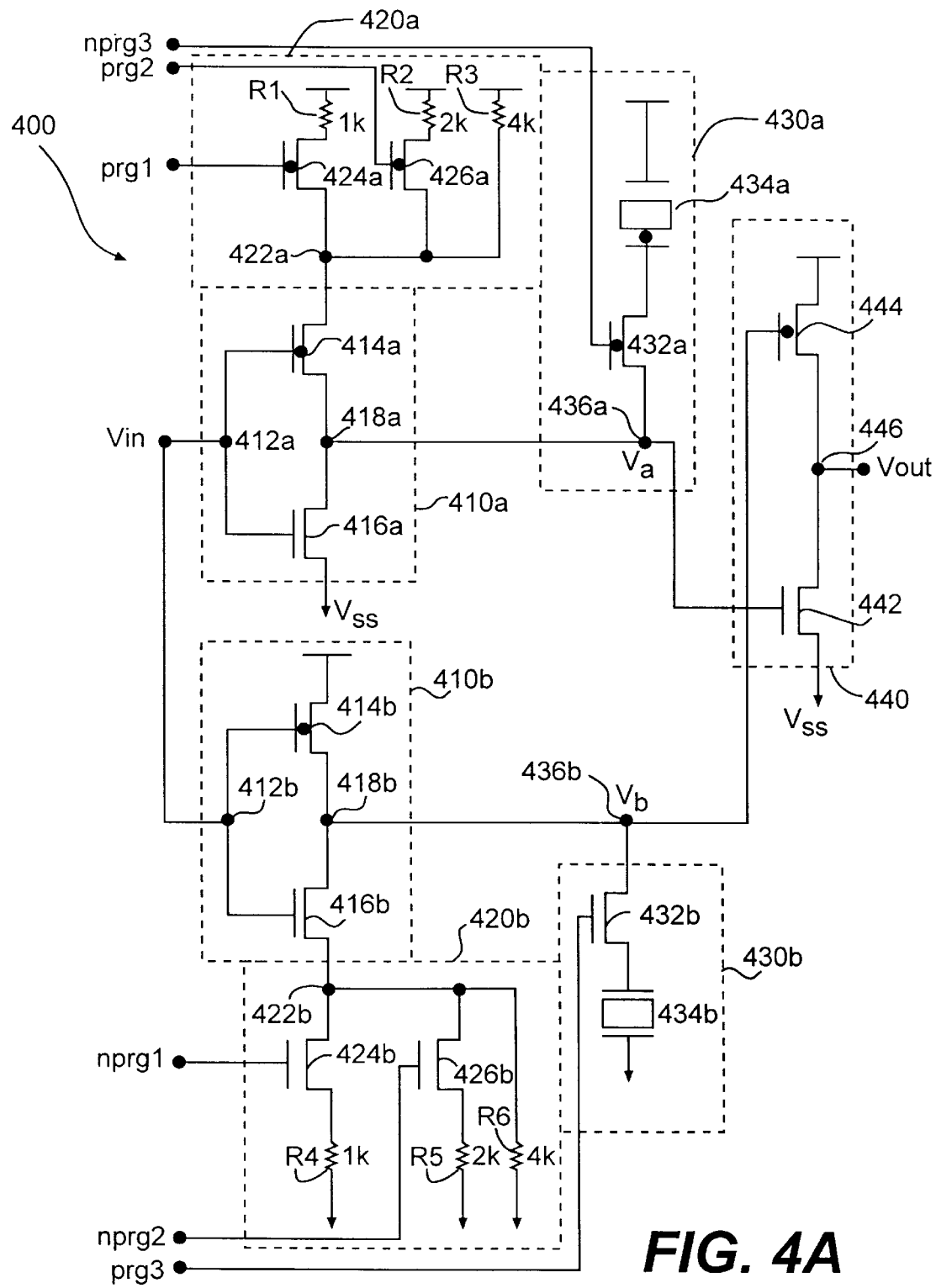
FIG. 4A is a circuit diagram of a tunable signal conditioning buffer.

In another embodiment, as shown in FIG. 4A, target circuit 101 is a signal conditioning buffer 400 and the tunable parameter is the rise and/or fall time of an output signal Vout generated at node 446 corresponding to the rise/fall time of intermediate signals Va, Vb at nodes 436a, 436b, respectively. Buffer 400 includes inverting stages 410a, 410b, resistive pull-up/pull-down circuits 420a, 420b, capacitive circuits 430a, 430b and an output stage 440. Hence, the tunable portion of buffer 400 includes pull-up circuits 420a, 420b and capacitive circuits 430a, 430b, while the function portion of buffer 400 includes inverting stages 410a, 410b and output stage 440. Note that other combinations of pull-up/pull-down and/or capacitive circuits coupled to Vdd/Vss are possible.

Inverting stage 410a includes a pair of FETs 414a, 416a which are coupled in series between node 422a and Vss (ground). The gates of FETs 414a, 416a are coupled to input node 412a of buffer 400. Output node 418a of inverting stage 410a is coupled to node 436a of capacitive circuit 430a and also to the gate of FET 442 of output stage 440.

Similarly, inverting stage 410b includes a pair of FETs 414b, 416b which are coupled in series between node 422b and Vdd (power). The gates of FETs 414b, 416b are coupled to input node 412b of buffer 400. Output node 418b of inverting stage 410b is coupled to node 436b of capacitive circuit 430b and also to the gate of FET 444 of output stage 440.

Resistive pull-up circuit 420a includes two pass FETs 424a, 426a and two corresponding load resistors R1, R2. The drains of pass FETs 424a, 426a are coupled to node 422a. Resistors R1, R2 are coupled between Vdd and the respective sources of FETs 424a, 426a. In addition, a load resistor R3 is permanently coupled between Vdd and node 422a. In this example, the resistive values of resistors R1, R2 and R3 are 1K ohm, 2K ohm and 4K ohm, respectively.

Similarly, resistive pull-down circuit 420b includes two pass FETs 424b, 426b and two corresponding load resistors R4, R5. The drains of pass FETs 424b, 426b are coupled to node 422b. Resistors R4, R5 are coupled between Vss and the respective sources of FETs 424b, 426b. In addition, a load resistor R6 is permanently coupled between Vss and node 422b. In this example, the resistive values of resistors R4, R5 and R6 are 1K ohm, 2K ohm and 4K ohm, respectively.

Hence pull-up resistive circuit 420a provides tuning capability for the fall-time of output signal Vout while complementary pull-down resistive circuit 420b provide tuning capability for the rise-time of output signal Vout. Although resistive circuits 420a, 420b each include two selectable resistors R1, R2, and R4, R5 respectively, it is apparent to one skilled in the art to modify circuits 420a, 420b by increasing or decreasing the number of resistor/FET pairs and/or to use different resistive values.

Capacitive circuit 430a includes a pass FET 432a and a capacitive load 434a coupled in series between node 436a and Vdd. Capacitive circuit 430b includes a pass FET 432b and a capacitive load 434b coupled in series between node 436b and Vss. Additional capacitive circuits can also be added to increase the tuning capability of buffer 400. In some embodiments, pass FETs 432a, 432b are replaced by fusible links.

Output stage 440 includes a pair of FETs 442, 444 coupled in series between Vdd and Vss. The gate of FET 442 is coupled to node 418a of inverter stage 410a and also to node Va capacitive circuit 430a, while the gate of FET 444 is coupled to node 418b of inverter stage 410b and also to node Vb of capacitive circuit 430b. Since output stage 440 is also an inverting stage, functionally, buffer 400 is a non-inverting.

The operation of buffer 400 is as follows. An input signal Vin is provided to input nodes 412a, 412b of buffer 400. In addition, tuning signals prg1, prg2, nprg3 ($\overline{prg3}$) are provided to the gates of pass FETs 424a, 426a and 432a, for selecting resistors R1, R2 and capacitive load 434a, respectively. Similarly, tuning signals nprg1 ($\overline{prg1}$), nprg2 ($\overline{prg2}$), prg3 are provided to the gates of pass FETs 424b, 426b and 432b, for selecting resistors R4, R5 and capacitive load 434b, respectively. The rise/fall tirnes of output signal Vout produced by buffer 400 is tuned by selectively engaging/disengaging one or more of resistor pairs R1, R4, and R2, R5 and capacitive load pair 434a, 434b.

FIG. 4B is a table showing representative rise/fall times of signals Va, Vb at nodes 436a, 436b, respectively, in response to the respective tuning patterns formed by tuning signals prg1, prg2, prg3. For example, by selecting both resistor pairs R1, R4, and R2, R5, the resistance of pull-up circuit 420a and the resistance of pull-down circuit 420b are reduced to a minimal level thereby increasing the speed of the rise time of output signal Vout. Similarly, by deselecting capacitive load pair 434a, 434b, the rise time of output signal Vout is speeded up. Conversely, by deselecting resistor pairs R1, R4 and R2, R5 and/or selecting capacitive load pair 434a, 434b, the rise time of output signal Vout can be slowed down. In this example, rise/fall times of signals Va/Vb t1<t2<t3< . . . t8. Note that since the power consumption of buffer 400 is dependent on the values of load resistors R1, R2, R4, R5, and capacitive loads, 434a, 434b selectable load resistors R1, R2, R4, R5 and capacitive loads 434a, 434b can also be used to control the power consumption of buffer 400 by using suitable tuning patterns provided to buffer 400 via pass FETs 424a, 426a, 424b, 426b, and pass FETs 432a, 432b, respectively.

Figure 5A:
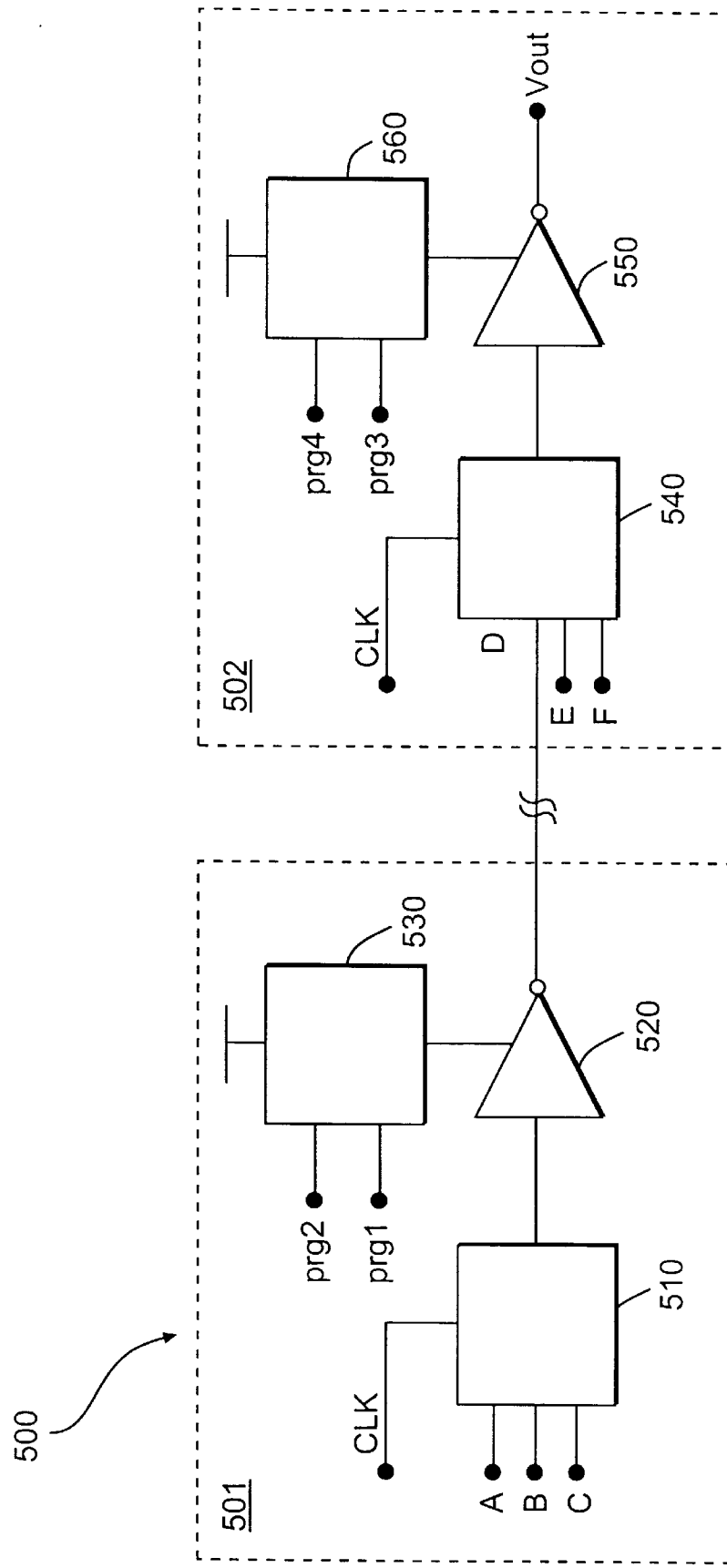
FIGS. 5A, 5B and 5C are block, logic and circuit diagrams, respectively, of a tunable "domino" logic circuit.
Figure 5B:
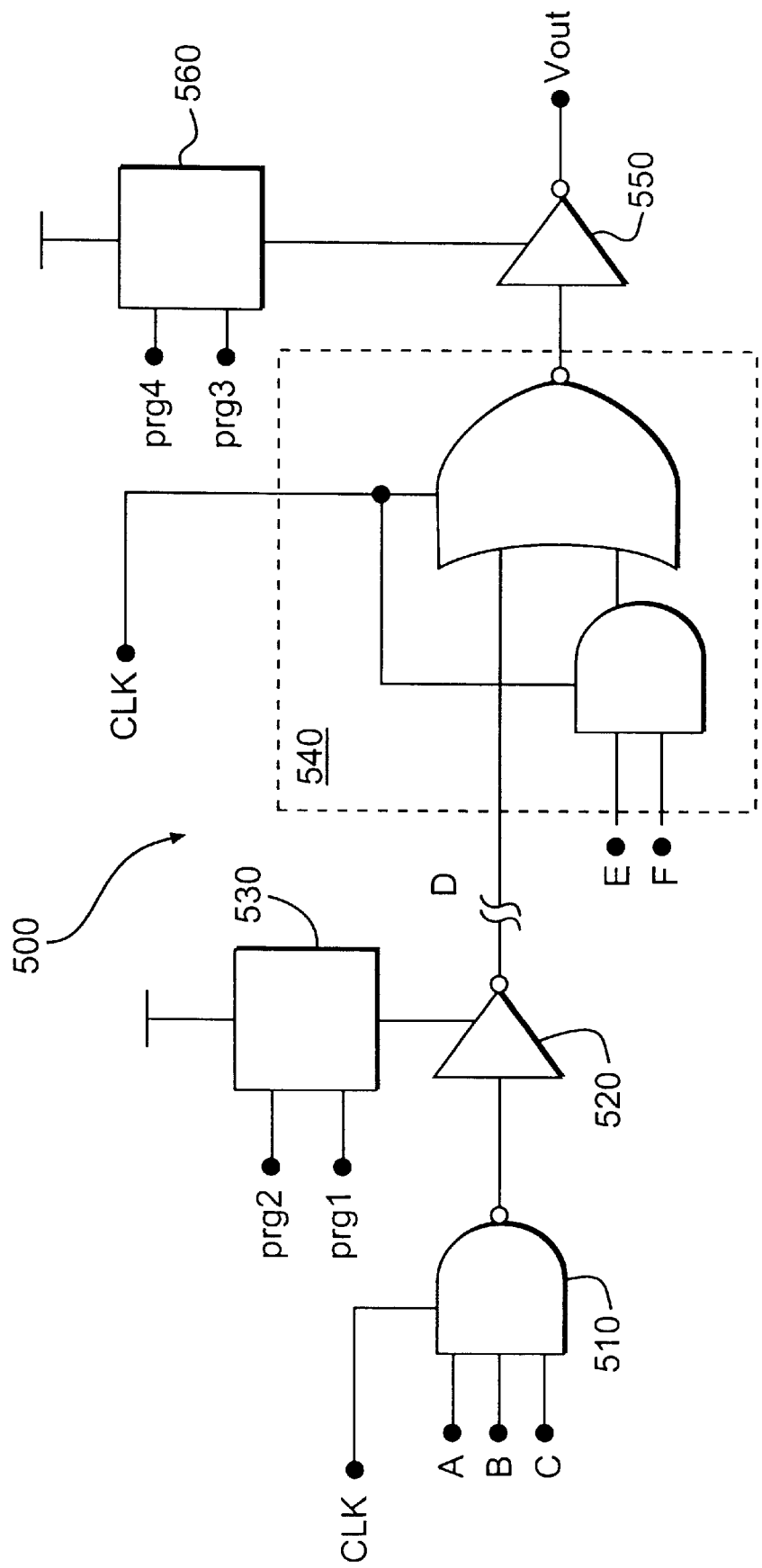
Figure 5C:
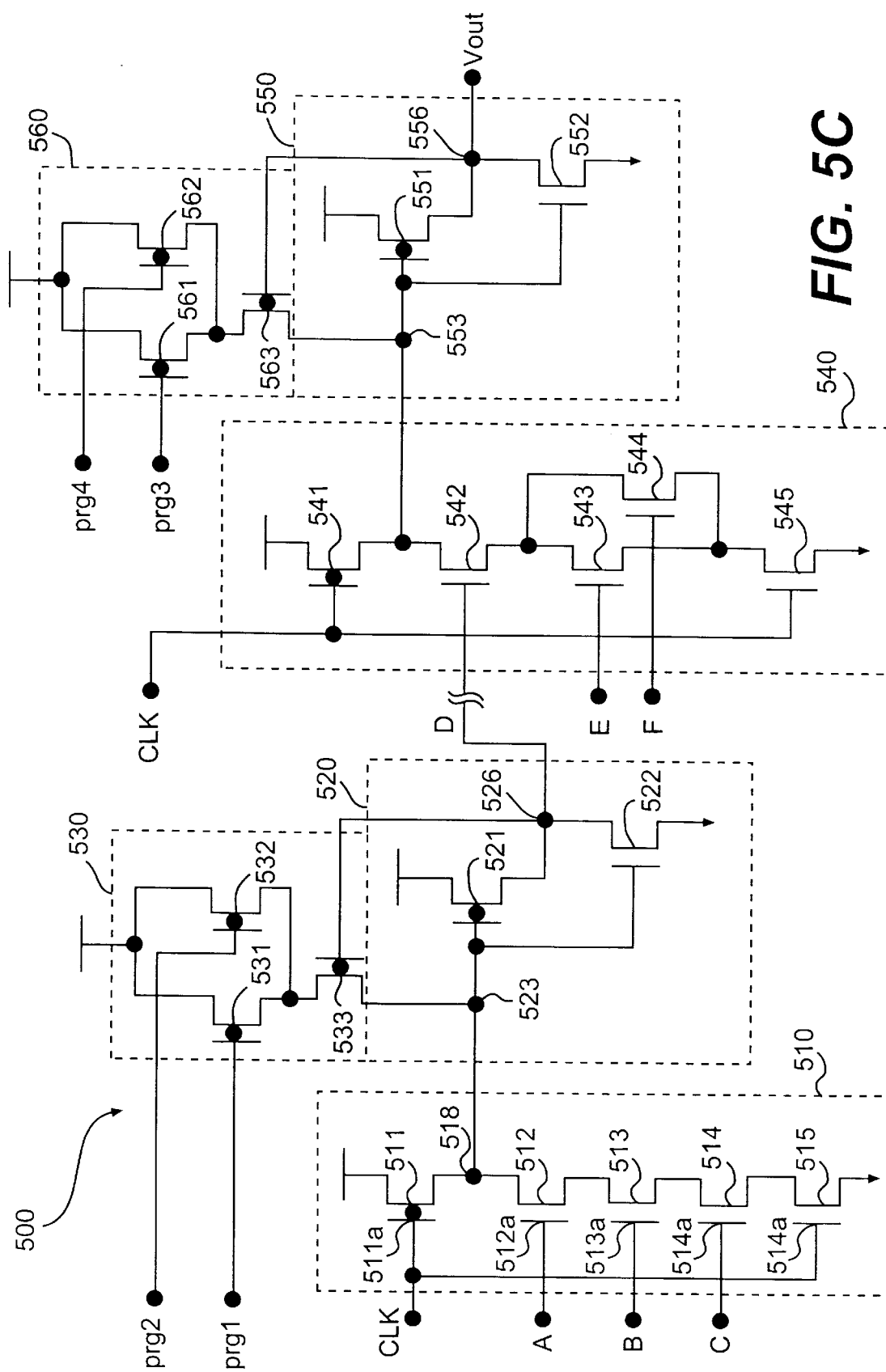

In yet another embodiment, as shown in the block, logic and circuit diagrams of FIGS. 5A, 5B and 5C, respectively, target circuit 101 is a "domino" logic circuit 500 having a tunable trip threshold voltage Vtrip. Referring first to the block diagram of FIG. 5A, circuit 500 includes two domino stages 501, 502 coupled in series. First domino stage 501 includes first logic stage 510, a first inverter 520 and a first pull-up circuit 530. Second domino stage 502 includes a second logic stage 540, a second inverter 550 and a second pull-up circuit 560. Note that additional "domino" logic stages can be added to circuit 500 depending on the application.

In this implementation, the output node of first logic stage 510 is coupled to the input node of first inverter 520. Inverter 520 is coupled to Vdd via first pull-up circuit 530. In turn, the output node of first inverter 520 is coupled to the input node of second logic stage 540. Similarly, the output node of second logic stage 540 is coupled to the input node of second inverter 550. Inverter 550 is coupled to Vdd via second pull-up circuit 560. Hence, logic stages 510, 540 and inverters 520, 550 form the functional portion, while pull-up circuits 530, 560 form the tunable portion.

FIG. 5B is a logical example of circuit 500 wherein first logic stage 510 provides a "NAND" function and second logic stage 540 provides a "G=D*(E+F)" logic function. ("+"="OR", "*"="AND") Referring now to FIG. 5C, an exemplary CMOS implementation of exemplary circuit 500 of FIG. 5B illustrates first and second domino stages 501, 502 in detail.

First logic stage, NAND gate 510, includes a PMOS FET 511 and three NMOS FETs 512, 513, 514 coupled in series between Vdd and Vss. A system clock signal CLK is provided at gate 511a of FET 511. The junction formed by the drains of FETs 511,512 is coupled to an output node 518. First inverter 520 includes a PMOS FET 521 and an NMOS FET 522 coupled in series between Vdd and Vss. An output node 526 is formed at the junction of the drains of FETs 521,522. First pull-up circuit 530 includes PMOS FETs 531, 532, 533, with the drain of FET 532 coupled to input node 523 of inverter 520, the source of FET 533 coupled to the drains of both FETs 531, 532, and the sources of FETs 531, 532 coupled to Vdd. The gate of FET 533 is also coupled to the output node 526 of inverter 520.

Second logic stage 540 includes PMOS FET 541 and NMOS FETs 542, 543, 544, 545. System clock signal CLK is provided at gates of FETs 541 and 545. FETs 541, 542, 543, 545 are coupled in series between Vdd and Vss. In addition, FETs 543 and 544 coupled to each other in parallel. The junction formed by the drains of FETs 541, 542 is coupled to input node 553 of second inverter 550. Second inverter 550 includes a PMOS FET 551 and an NMOS FET 552 coupled in series between Vdd and Vss. An output node 556 is formed at the junction of the drains of FETs 551, 552 is coupled to output node Vout. Second pull-up circuit 560 includes PMOS FETs 561, 562, 563, with the drain of FET 563 coupled to input node 553 of inverter 550, the source of FET 563 coupled to the drains of both FETs 561, 562, and the sources of FETs 561, 562 coupled to Vdd. The gate of FET 563 is also coupled to the output node 556 of inverter 550. The operation of domino stages 501, 502 is as follows.

Input logic signals A, B and C are provided at gates 512a, 513a, 514a of FETs 512, 513, 514, respectively. As a result, output node 518 of NAND gate 510 provides a logical NAND of input signals A, B, C, i.e., $\overline{A*B*C}$, to input node 523 of inverter stage 520. In turn, inverter stage 520 provides an output logic signal D, wherein "D =A*B*C", at output node 526.

The "D" logic signal is provided at the gate of FET 542. In addition, input logic signals E and F are provided at the gates of FETs 543, 544. As discussed above, second logic stage 540 provides a "G=$\overline{D*(E+F)}$" logic function. Hence, the logical function provided by the combination of domino stages 501 and 502 is "G=(A*B*C)*(E+F)".

Since the tuning portions of domino circuits 501, 502 are similar, the following description of pull-up circuit 530 is also applicable to pull-up circuit 560. In accordance with the invention, tuning pattern signals prg1, prg2 are provided to the respective gates of FETs 531, 532 thereby enabling a designer to adjust the threshold trip voltage Vtrip, of first domino stage 501. Similarly, tuning pattern signals prg3, prg4 are provided to the respective gates of FETs 561, 562 control the threshold trip voltage Vtrip of second domino stage 502. Hence, tuning pattern signals prg1, prg2, prg3 and prg4 can be used to vary the Vtrip of output signal Vout generated by circuit 500.

FIG. 5D is a table illustrating exemplary trip voltage Vtrip of first domino stage 501 as a function of tuning pattern signals prg1, prg2. In this example, different combinations of tuning pattern signals prg1, prg2 produces Vtrip voltage levels ranging between 0.5 volts and 1.3 volts. Since pull-up circuits 530, 560 are similar in operation, tuning signals prg3, prg4 will vary the Vtrip of second domino stage 502 in a similar manner. Other voltage ranges and intervals are possible by adding additional pull-up circuit(s) to domino logic circuit 500, thereby extending the Vtrip voltage range and granularity of voltage intervals.

Figure 6A:
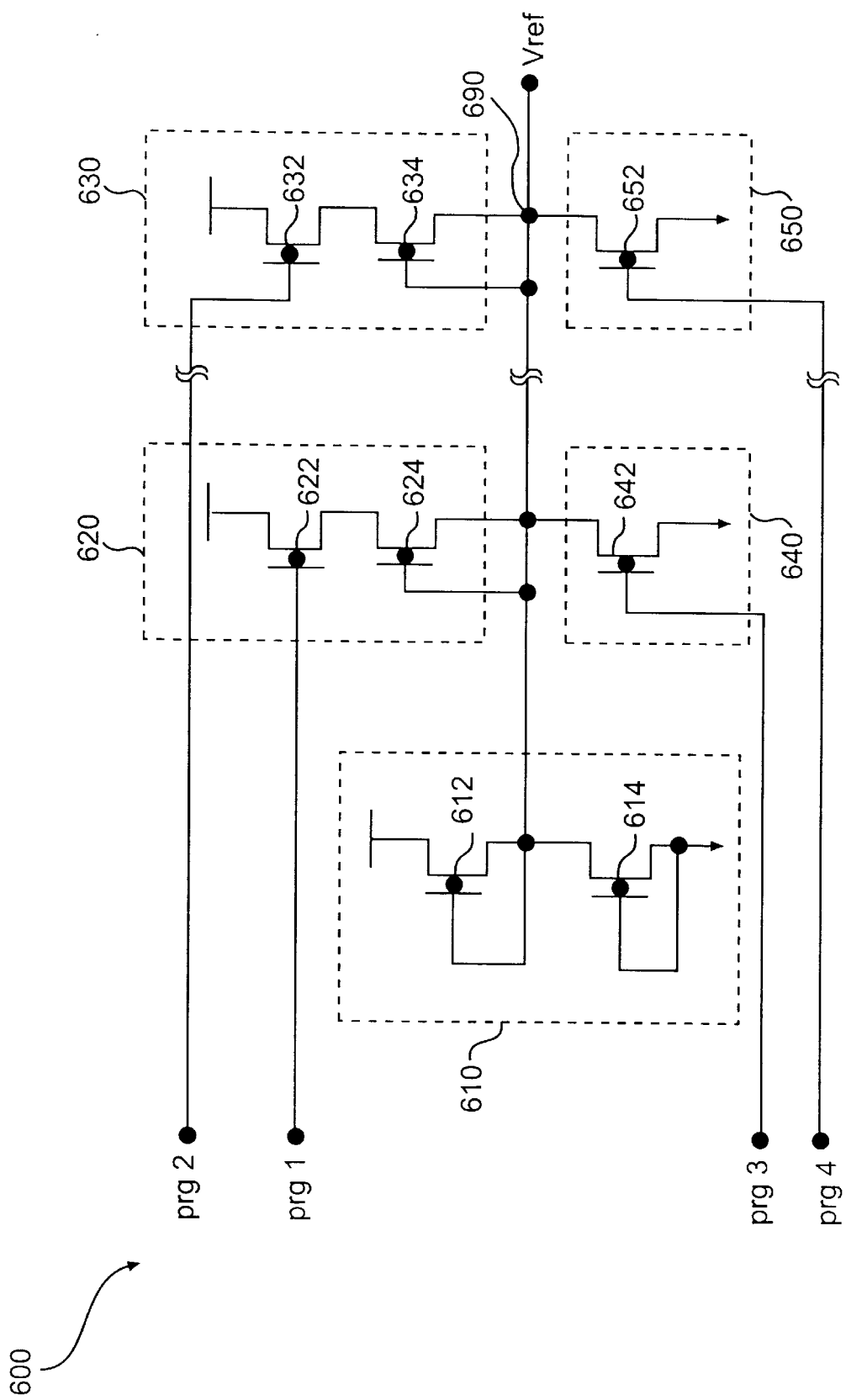
FIG. 6A is a circuit diagram of a tunable reference voltage generator.

FIG. 6A is a circuit diagram of another embodiment of targeted circuit 101. In this embodiment, targeted circuit 101 is a reference voltage generator 600 and the tunable parameter is a reference voltage Vref produced by generator 600. Voltage generator 600 includes a voltage divider 610, first and second pull-up circuits 620, 630, and first and second pull-down circuits 640, 650. Functional portion includes voltage divider 610 while tunable portion includes circuits 620, 630, 640, 650. While P-channel FETs are described in this embodiment, it will be apparent to one skilled in the art to substitute N-channel FETs in place of the P-channel FETs with the appropriate modifications.

Voltage divider 610 includes a pair of FETs 612, 614 coupled in series between Vdd and Vss. The gate and drain of FET 612 and the source of FET 614 are coupled to output node 690. The gate and drain of FET 614 are coupled to Vss.

First pull-up circuit 620 includes FETs 622, 624 coupled in series between Vdd and output node 690. The gate of FET 624 is also coupled to output node 690. First pull-down circuit 640 includes an FET 642 whose source and drain are coupled to output node 690 and Vss, respectively. In this embodiment, second pull-up circuit 630, similar in structure to first pull-up circuit 620, provides additional voltage range for reference voltage Vref. Additional pull-up circuits can be added to further increase the range of voltage Vref.

In this embodiment, second pull-down circuit 650, similar in structure to first pull-down circuit 640 provide additional voltage range for reference voltage Vref. Additional pull-down circuits can be added to further increase the range of voltage Vref.

Tuning of voltage generator 600 is accomplished by tuning pattern signals prg1, prg2, prg3, prg4 provided at the gates of FETs 622, 632, 642, 652, respectively. By selecting one or more pullup circuits 620,630, reference voltage Vref can be incrementally increased. Conversely, by selecting one or more pull-down circuits 640, 650, reference voltage can be incrementally decreased. FIG. 6B is a table showing exemplary voltages levels of reference Vref in response to tuning pattern signals prg1, prg2, prg3 and prg4, wherein Vdd is 2.5 volts.

Tuning pattern signals prg1, prg2, prg3, prg4 can also be used to control the impedance of voltage generator 600. FIG. 6C show exemplary impedances of generator 600 in response to tuning pattern signals prg1, prg2, prg3 and prg4.

Figure 7A:
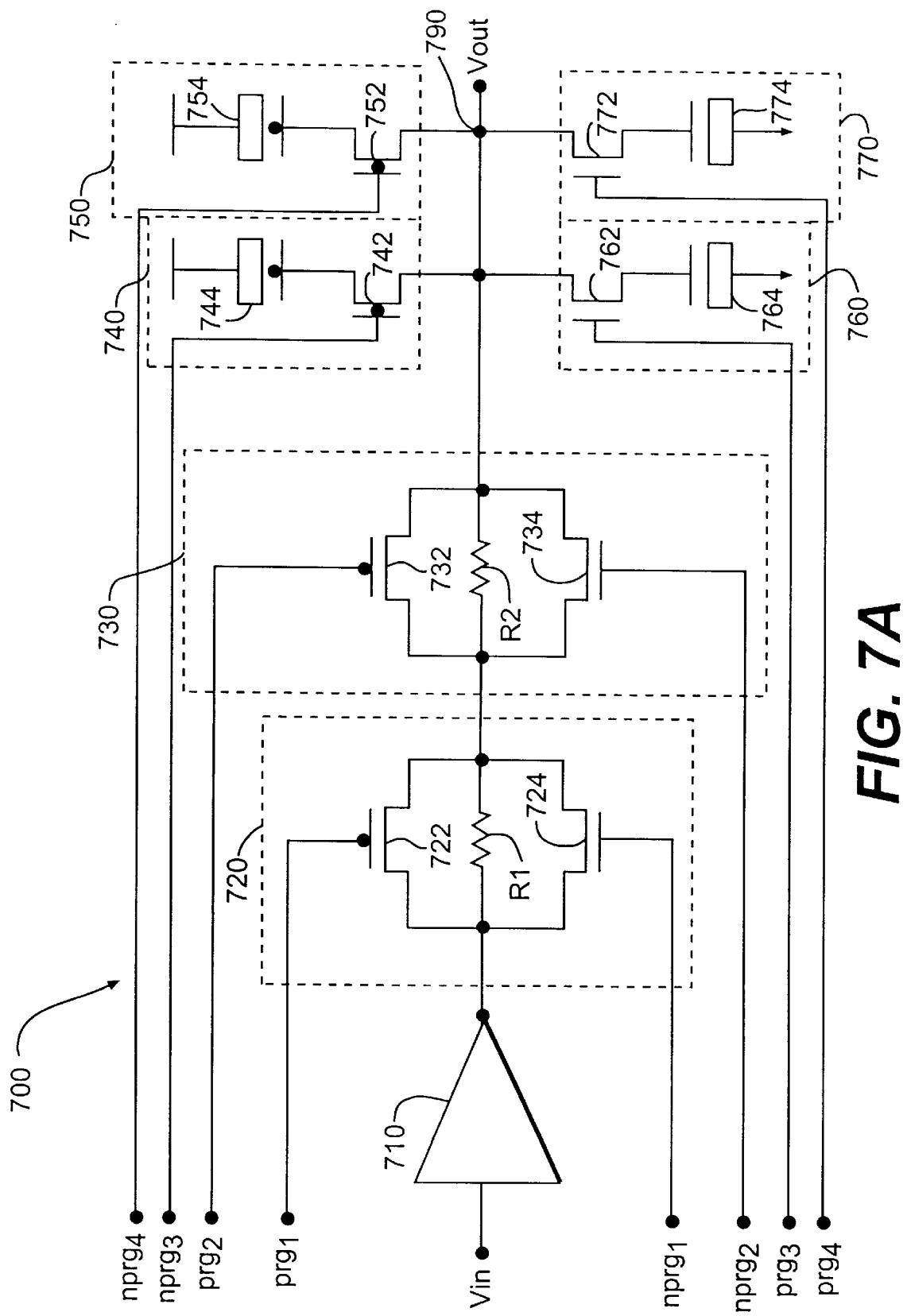
FIG. 7A is a circuit diagram of a tunable inverting buffer.

Referring now to FIG. 7A illustrating yet another embodiment of target circuit 101, target 101 is an inverting buffer 700 including an inverting stage 710, first and second resistive stages 720, 730, capacitive circuits 740, 750, 760 and 770. Resistive stage 720 includes a P-channel FET 722, an N-channel FET 724 and a first resistor R1 coupled in parallel. Similarly, resistive stage 730 includes a P-channel FET 732, an N-channel FET 734 and a second resistor R2 coupled in parallel. Each of capacitive circuits 740.750 include a P-channel FET and a capacitive load coupled in series between Vdd and output node 790, while each of capacitive circuits 760, 770 include an N-channel FET and a capacitive load coupled in series between output node 790 and Vss.

Functionally, resistive stages 720, 730 provide coarse rise/fall time control for buffer 700. Capacitive circuits 740, 750, 760, 770, are functionally similar to capacitive circuits in the embodiment of FIG. 4A, and provide fine control for either rise/fall-time and consequently power consumption of buffer 700.

Tuning pattern signals prg1, prg2, nprg3 ($\overline{prg3}$), nprg4 ($\overline{prg4}$) are provided to the gates of pass FETs 722, 732, 742, 752. Similarly, tuning pattern signals nprg1 ($\overline{prg1}$), nprg2 ($\overline{prg2}$), prg3, prg4 are provided to the gates of pass FETs 724, 734, 762, 772. Resistor R1 of resistive stage 720 is bypassed by turning on both FETs 722 and 724. Similarly, resistor R2 of resistive stage 730 is bypassed by turning on both FETs 732 and 734. Capacitive circuits 740,750,760, 770, are selected by turning on FETs 742, 752, 762, 772, respectively. FIG. 7B is a table showing exemplary rise/fall times of output signal Vout generated by buffer 700 as a function of tuning patterns. In this example, rise/fall times of output signal Vout t1<t2<t3 . . . <t16.

While the invention has been described with reference to specific embodiments, numerous additions and modifications are possible without departing from the spirit of the invention. For example, the pass FET(s) of target circuits may be replaced by fusible links to effect permanent changes or by analog switches capable of selecting a suitable value within a range of tuning parameters. Hence, the scope of the invention should be determined by the following claims.

What is claimed is:

1. A method for tuning an integrated circuit (IC) after fabrication of said IC which has at least one target parameter functioning outside of a proper operating range of values due to a fabrication process, said IC including a target circuit including a tunable portion and a functional portion for performing an intended function, the method comprising:

providing a tuning pattern;

decoding said tuning pattern;

generating a tuning signal corresponding to said decoded tuning pattern when it is desirable to tune said integrated circuit (IC) to a target parameter; and providing said tuning signal to said tunable portion for changeably modifying the operation of said target circuit thereby causing said functional portion to operate in a manner wherein said target parameter is within a predetermined range while said functional portion remains enabled, wherein said target parameter is a threshold/trip voltage of said functional portion.

2. A tunable integrated circuit (IC) comprising:

a target circuit including a tunable portion and a functional portion for performning an intended function;

a tuning controller for generating a tuning signal for said target circuit corresponding to a tuning pattern when it is desirable to tune said integrated circuit (IC) to a target parameter, said tuning signal changeably modifying the operation of said target circuit thereby causing said functional portion to operate in a manner wherein said target parameter is within a predetermined range while said functional portion remains enabled, said tuning controller including a decoder for decoding said tuning pattern, wherein said target parameter is a threshold/trip voltage of said functional portion.

3. A tuning controller useful in association with tuning a target circuit of an integrated circuit, the target circuit including a tunable portion and a functional portion for performing an intended function, said tuning controller comprising:

a latch for producing a tuning signal to said target circuit when it is desirable to tune said integrated circuit (IC) to a target parameter, said tuning signal changeably modifying the operation of said target circuit thereby causing said functional portion to operate in a manner wherein said target parameter is within a predetermined range while said functional portion remains enabled, wherein said target parameter is a threshold/trip voltage of said functional portion.

4. The method of claim 1, wherein the functional portion includes a first logic stage.

5. The method of claim 4, wherein the functional portion includes a second logic stage connected to the first logic stage.

6. The method of claim 1, wherein the tunable portion includes a pull-up circuit.

7. The method of claim 6, wherein the pull-up circuit is connected to a logic gate to adjust the logic gate's threshold/trip voltage.

8. The method of claim 6, wherein said tuning signal tunes said pull-up circuit so that the functional portion has one of a plurality of different threshold/trip voltages.

9. The tunable integrated circuit of claim 2, wherein the functional portion includes a first logic stage.

10. The tunable integrated circuit of claim 9, wherein the functional portion includes a second logic stage connected to the first logic stage.

11. The tunable integrated circuit of claim 2, wherein the tunable portion includes a pull-up circuit.

12. The tunable integrated circuit of claim 2, wherein the pull-up circuit is connected to a logic gate to adjust the logic gate's threshold/trip voltage.

13. The tunable integrated circuit of claim 2, wherein said tuning signal tunes said pull-up circuit so that the functional portion has one of a plurality of different threshold/trip voltages.

14. The tunable integrated circuit of claim 3, wherein the functional portion includes a first logic stage.

15. The tunable integrated circuit of claim 14, wherein the functional portion includes a second logic stage connected to the first logic stage.

16. The tunable integrated circuit of claim 3, wherein the tunable portion includes a pull-up circuit.

17. The tunable integrated circuit of claim 16, wherein the pull-up circuit is connected to a logic gate to adjust the logic gate's threshold/trip voltage.

18. The tunable integrated circuit of claim 16, wherein said tuning signal tunes said pull-up circuit so that the functional portion has one of a plurality of different threshold/trip voltages.

* * * * *

UNITED STATES PATENT AND TRADEMARK OFFICE
CERTIFICATE OF CORRECTION

PATENT NO.   : 5,973,541
DATED        : October 26, 1999
INVENTOR(S)  : RAJIVAN et al.

It is certified that error appears in the above-identified patent and that said Letters Patent is hereby corrected as shown below:

In Claim 12, col. 10, line 44, "claim 2" should read --claim 11--.

In Claim 13, col. 10, line 47, "claim 2" should read --claim 11--.

Signed and Sealed this

Twenty-fifth Day of July, 2000

Attest:

Q. TODD DICKINSON

Attesting Officer

Director of Patents and Trademarks